(12) United States Patent
Uchida

(10) Patent No.: US 6,228,704 B1
(45) Date of Patent: May 8, 2001

(54) PROCESS FOR MANUFACTURING SEMICONDUCTOR INTEGRATED CIRCUIT DEVICE

(75) Inventor: Tetsuya Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/282,216

(22) Filed: Mar. 31, 1999

(30) Foreign Application Priority Data

Mar. 31, 1998 (JP) .................................................. 10-104100

(51) Int. Cl.$^7$ ................................................ H01L 21/8242
(52) U.S. Cl. ........................... 438/241; 438/220; 438/224; 438/414
(58) Field of Search ..................................... 438/241, 197, 438/201, 585, 289, 302, 303, 304, 231, 232, 217, 194, 163, 278, 291, 220, 223, 224, 275, 216, 414; 427/523

(56) References Cited

U.S. PATENT DOCUMENTS 5,891,780 * 4/1999 Hasegawa et al. .................. 438/278

FOREIGN PATENT DOCUMENTS 251449 9/1999 (JP) .

OTHER PUBLICATIONS

T. Yokoyama et al, Symp. on ULSi Tech. Dig., p. 145.

* cited by examiner

*Primary Examiner*—Charles Bowers
*Assistant Examiner*—Yennhu B. Huynh
(74) *Attorney, Agent, or Firm*—Foley & Lardner

(57) ABSTRACT

To provide a process for manufacturing a semiconductor integrated circuit device in which ion implantation of an embedded diffused layer for forming triple-well and oxide film etching for forming two types of gate oxide films having different thicknesses is performed by only one photoetching step, the process being capable of reducing the manufacturing cost, and speeding up the circuit operation by making the gate oxide film of the peripheral unit thinner than that of the I/O circuit unit. A resist mask having a given width ranging in a given range which will be formed on the silicon oxide film is formed in a gate forming area in a region where an embedded N-type layer will be formed in a P-type silicon substrate and it is desired to make the thickness of the gate oxide film thicker. The embedded N-type layer is also formed even immediately below the resist mask by conducting an ion implantation at a given energy via the resist mask. The oxide film is etched out by using the resist mask as a mask and the gate oxide film is then formed thereon.

17 Claims, 11 Drawing Sheets

Tr1, Tr2 ; DRIVER TRANSISTOR
Tr3, Tr4 ; ACCESS TRANSISTOR
R1, R2   ; HIGH RESISTOR LOAD
R, S     ; BIT LINE

PROCESS FOR MANUFACTURING SEMICONDUCTOR INTEGRATED CIRCUIT DEVICE

FIELD OF THE INVENTION

The present invention relates to a process for manufacturing semiconductor integrated circuit device and in particular to a process for manufacturing a semiconductor integrated circuit device having a triple-well structure and two types of gate oxide film having different thicknesses in one chip.

BACKGROUND

In a process for manufacturing a semiconductor integrated circuit device having a triple-well structure and two types of gate oxide film having different thicknesses in one chip, a manufacturing process in which ion implantation toward an embedded diffused layer for forming a triple-well and etching of oxide film to form two types of gate oxide film having different thicknesses in one chip is achieved by passing, preferably, one photo resist step has become one of great concerns.

The reason why a configuration having a triple-well structure and two types of gate oxide films having different thicknesses in one chip has been demanded will be described.

Firstly, necessity of a triple-well will be described. Semiconductor integrated circuit devices such as DRAMs (dynamic random access memories) and SRAMs (static random memories) are generally formed with peripheral circuit and input/output units comprising CMOSs. Their silicon substrates are formed with N-type and P-type wells. If the internal power source voltage is made lower than the external power source voltage for reduction in power consumption, it is necessary to insulate N-type wells from each other to which internal and external power source voltages are applied, respectively. In DRAMs and SRAMs, the P-type wells of memory cell unit should be electrically insulated from the other P-type wells for protecting the memory cells from electrical noises from the peripheral and input/output (I/O) circuit units.

In order to electrically insulate N-type wells from each other and P-type wells from each other in such a manner, it is necessary to provide a triple-well structure by forming an embedded diffused layer.

Necessity to use two types of gate oxide film having different thicknesses in one chip will now be described.

If the external and internal power source voltages are different in a semi conductor integrated circuit device such as DRAM and SRAM, a voltage which is higher than that of the peripheral circuit unit to which the internal power source voltage is applied is applied to the gates of MOS transistors of I/O circuit unit, to which external power source voltage is applied.

If the voltage for word line is stepped up in a memory cell unit of DRAMs and SRAMs, a voltage which is higher than that of the peripheral circuit is applied to the gates of MOS transistors of the memory cells.

If only one gate oxide film is used in one chip, the thickness of the gate oxide film should be set to meet the requirements of a MOS transistor to which the highest gate voltage is applied for assuring the reliability of the gate oxide film. Accordingly, if the external and internal power source voltages are different, or stepping up of word line voltage is conducted, the thickness of the gate oxide film should be set to meet the requirements made by the higher voltage of the I/O circuit units and memory cells.

As a result, the gate oxide film having a thickness which is larger than that the film needs will be provided in the peripheral circuit units. The thicker the gate oxide film becomes, the less the turn-on current (the current which flows through the transistor when it is conductive) of the MOS transistor becomes. This results in a low operation speed of the circuit.

On the other hand, if two types of gate oxide films having different thicknesses are formed in one chip, the operation speed of the circuit can be made faster by making the gate oxide film of the peripheral circuit unit thinner than that of the other units to increase the turn-on current of the transistor. In such a manner, it is necessary to use two types of gate oxide films having different thicknesses in one chip for making the operation speed faster.

As mentioned above, the configuration including a triple-well structure and two types of gate oxide films having different thickness in one chip is very useful.

SUMMARY OF THE DISCLOSURE

Japanese patent application No. 10-053912(filed by the same applicant with this application and has not been published yet on filing of this application) which was filed prior to this application discloses a process for implementing the two structures while suppressing an increase in the number of steps.

This process enables the ion implantation of the embedded diffused layer for triple-well formation and etching of an oxide film for forming two types of gate oxide film having different thicknesses in one chip to be carried out through only one PR (photo resist) step.

However, this process has a problem as follows:

An N-type silicon substrate is used. The N-type silicon substrate is more expensive than P-type silicon substrate, resulting in high cost of device manufacturing.

Also even if a cheaper P-type silicon substrate is used, the thickness of the gate oxide film of the I/O circuit units is equal to that of the peripheral circuit units.

Accordingly, if the external voltage source voltage is higher than the inner power source voltage, the thickness of the I/O and peripheral circuit units must be preset to meet the requirements due to the higher external power source voltage.

Accordingly, the gate oxide film of the peripheral circuit units becomes thicker than required in view of reliability to decrease the turn-on current. This results in a slow circuit operation speed. This circuit configuration is not satisfactory in speeding up of the circuit operation.

Therefore, the present invention was made in view of the above mentioned technical problems. It is an object of the present invention to provide a process for manufacturing a semiconductor integrated circuit device in which ion implantation of an embedded diffused layer for forming a triple-well and etching of an oxide film for forming two types of gate oxide film having different thicknesses in one chip by only one PR step, which decreases the cost and speeds up the circuit by making the gate oxide film of the peripheral circuit unit thinner than that of the I/O circuit unit.

Further objects of the present invention will become apparent in the entire disclosure.

According to an aspect of the present invention, there is provided a process for manufacturing a semiconductor integrated circuit device is characterized in that a resist mask having a given width within a given range is formed at a gate forming area where a large thickness is desired of a gate oxide film of an active element in a region where a second conductive type embedded layer is formed in a first conductive type substrate, and in that the given width of the resist mask is preset so that the embedded layer is also formed immediately below said resist mask having the given width when the embedded layer is formed by implanting ions via the resist mask at a given implanting energy.

In another aspect of the present invention, there is provided a process for manufacturing a semiconductor integrated circuit device characterized in that the resist mask is patterned on an oxide film formed on the entire surface of said substrate, and in that the oxide film not covered with the resist mask is removed by using the resist mask as an etching mask followed by forming an oxide film over the entire surface, whereby two types of gate oxide film having different thicknesses are formed in one chip by only one exposure step. The substrate is preferably made of P-type silicon for reduction in cost.

PREFERRED EMBODIMENT OF THE INVENTION

The present invention enables ion implantation of an embedded diffused layer for forming a triple-well and etching of an oxide film to form two types of gate oxide film having different thicknesses in one chip to be conducted by only one photo resist (PR) step.

In a preferred embodiment of a process for manufacturing a semiconductor integrated circuit device of the present invention, a P-type silicon substrate is used and a PR (photo resist) mask having a given width within a given range, preferably 0.6 $\mu$m or less at an area where a gate oxide film having a thick thickness is to be formed (in a region where an embedded N-type layer is formed like the input/output circuit unit and a gate oxide film having a large thickness will be formed) and ion implantation for forming the embedded N-type layer is conducted at a high energy via the resist mask.

Figure 1:
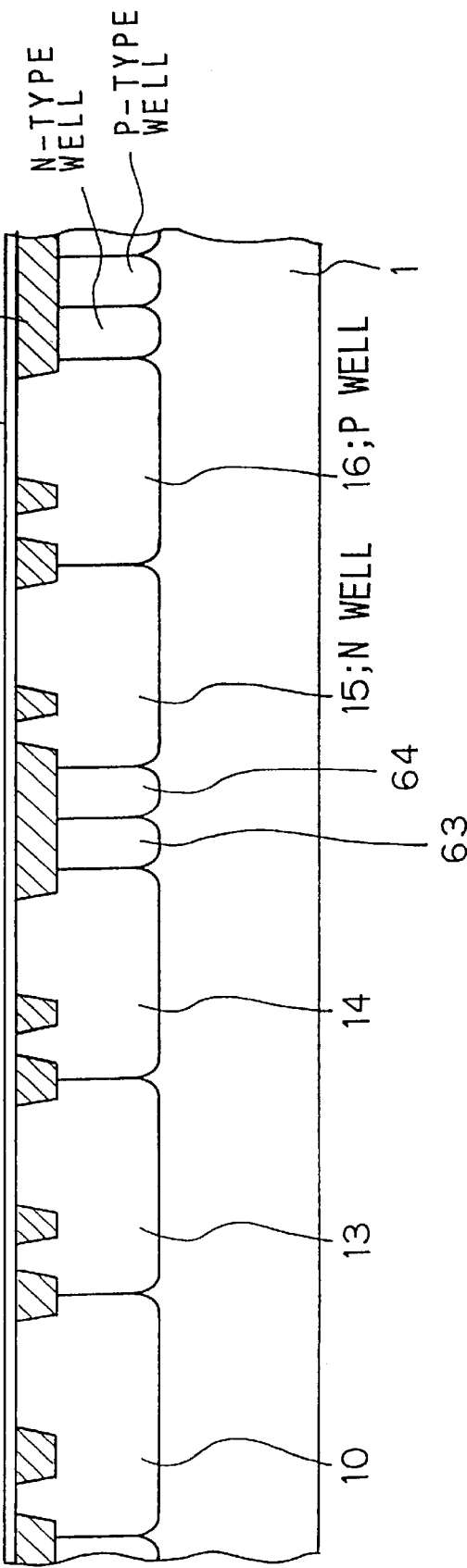
FIG. 1 is a sequential sectional view (1/5) explaining the manufacturing process of one embodiment of the present invention in sequential order.

Specifically, the process for manufacturing process of the present invention will be described with reference to an embodiment which is applied for the manufacturing of a DRAM (dynamic random access memory). Referring now to FIG. 1, a P-type silicon substrate (1) is formed with an element isolation area (2) and well and is formed with a thin silicon oxide film (33) over the entire surface of the substrate.

Figure 2:
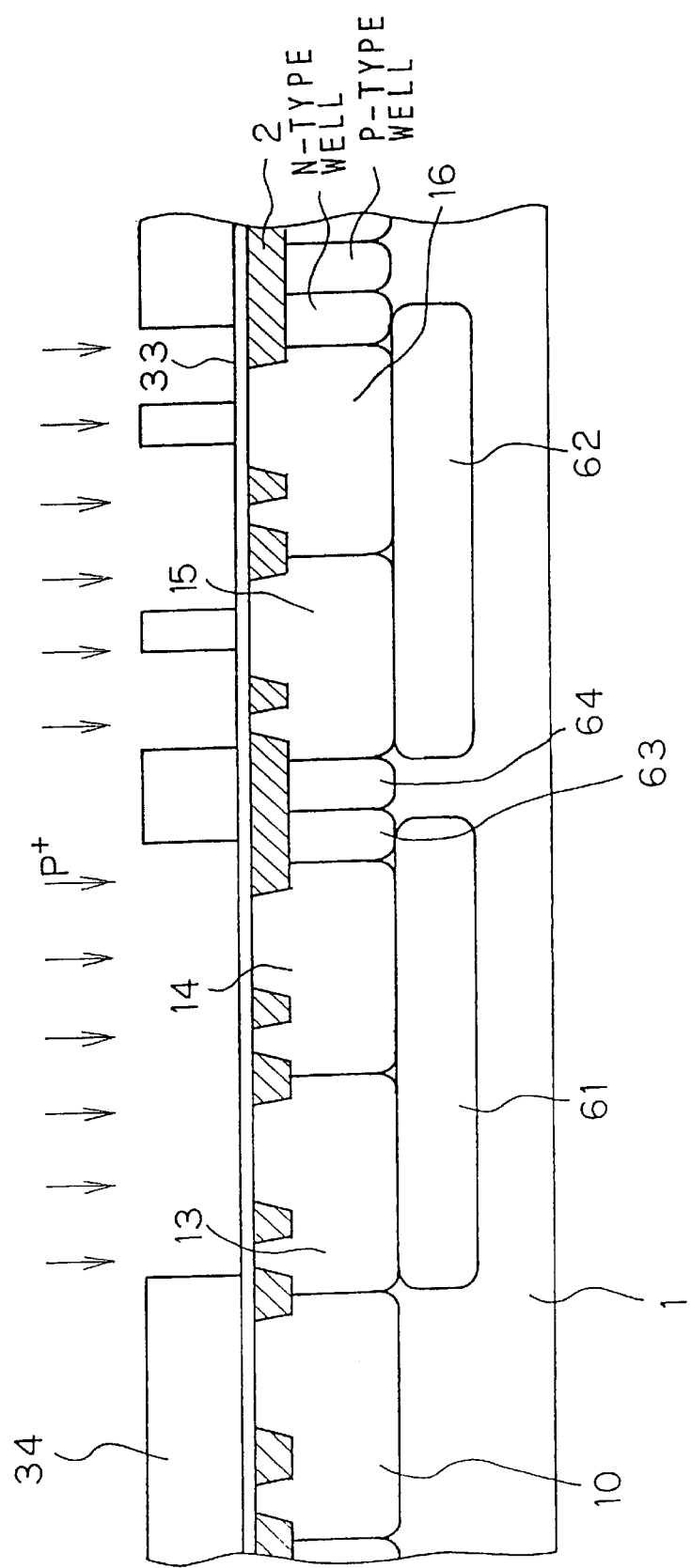
FIG. 2 is a sequential sectional view (2/5) explaining the manufacturing process of one embodiment of the present invention in sequential order.

Referring now to FIG. 2, a resist mask (34) is formed which is used for both ion implantation for forming the embedded N-type layer and oxide film etching for forming two types of gate oxide films having different thicknesses in one chip. At this time, in the region in which the embedded N-type layer is formed like the I/O circuit unit (33 of FIG. 1) and a thick gate oxide film is formed, a resist mask (34) having a given width within a given range, preferably 0.6 $\mu$m or less is formed at an area where a gate is to be formed.

Embedded N-type layers (61, 62) are formed by implanting phosphorous ions (P$^+$) at a high energy via this resist mask.

Then, the silicon oxide film (33) at the area which is not masked with the resist mask (34) is removed by etching.

Figure 3:
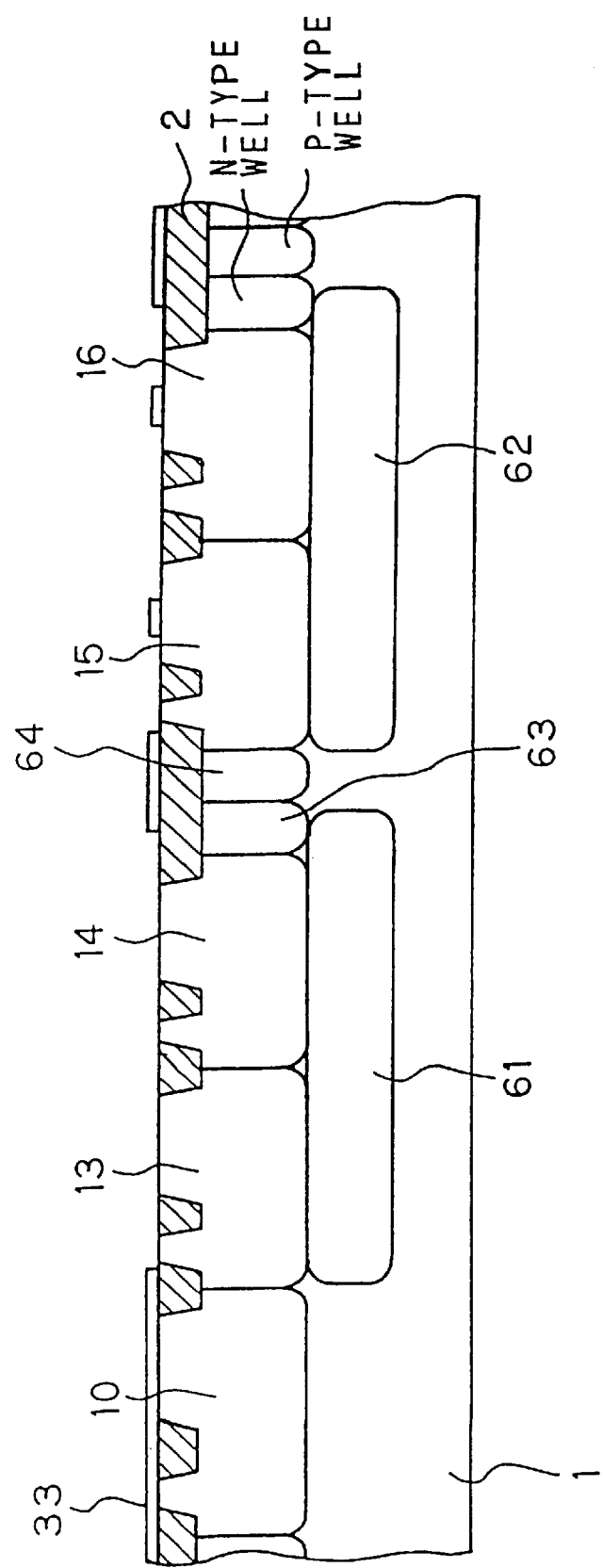
FIG. 3 is a sequential sectional view (3/5) explaining the manufacturing process of one embodiment of the present invention in sequential order.

Thereafter, the gate oxide film is formed by removing the resist mask (34) as shown in FIG. 3. Thereafter, a DRAM is manufactured in accordance with usual manufacturing process.

In the manufacturing process of the present invention, the embedded N-type layer is also formed even immediately below the resist mask (34) at the area in which the width of the resist mask (34) is within a given value, preferably not higher than 0.6 $\mu$m on the ion implantation for forming the embedded N-type layer due to the lateral spread(diffusion) of the implanted ions.

A thick gate oxide film is formed at the area where the resist mask (34) was disposed.

In such a manner, the embedded N-type layer and thick gate oxide film can be formed at the same area by conducting only one photo resist step in accordance with the manufacturing process of the present invention.

In the present invention, the ion implantation for forming the embedded N-type layer may be conducted in an oblique direction with respect to the perpendicular direction. In this case, the embedded N-type layer can be positively formed also even immediately below the resist mask at the area where the resist mask has the given width within a given range (0.6 $\mu$m).

The manufacturing process of the present invention is applicable to the manufacturing of SRAMs (static random access memories). In this case, a resist mask having a given width, preferably a width not larger than 0.6 $\mu$m is formed only at an area where the gate of an access transistor will be formed in an SRAM memory cell. By doing so, an embedded N-type layer can be formed over the entire of the memory cell unit and only the gate oxide film of the access transistor in the memory cell can be thickened.

The present invention provides operation and advantages as follows:

Since the P-type silicon substrate is used, the manufacturing cost is reduced.

Speeding up of the circuit operation can be achieved since only the gate oxide films of, for example, the access transistor in the I/O circuit unit of DRAM and SRAM memory cell, to which a higher voltage is applied, can be selectively formed to provide its thicker film while the other gate oxide films can remain thinner, resulting in that the on-current of the transistor in the other portion becomes higher, thereby speeding-up the circuit.

In order to describe the mode of embodying the present invention in more detail, the invention will be described by way of embodiments with reference to the drawings.

[Embodiment 1]

A first embodiment of the present invention in which a manufacturing process of the present invention is applied to the manufacturing of a DRAM will be described. FIGS. 1 through 5 are sequential sectional views showing the steps in the first embodiment in order.

Referring now to FIG. 1, element isolation areas 2 are formed on the surface of a P-type silicon substrate 1 by the trench isolation method. Subsequently, N-type wells are formed by implanting phosphorous ions into N-type well forming areas 13, 15, 63 at an implanting energy of 700 KeV and an dose of $2\times10^{13}$ cm$^{-2}$ using known resist mask and photolithography techniques, and P-type wells are formed by implanting boron ions into P-type well forming areas 10, 14, 16, 64 at an implantation energy of 300 KeV and a dose of $2\times10^{13}$ cm$^{-2}$.

Subsequently, a silicon oxide film 33 having a thickness of 4 nm (nanometer) is formed on the surface of the substrate by conducting thermal oxidation.

Figure 6:
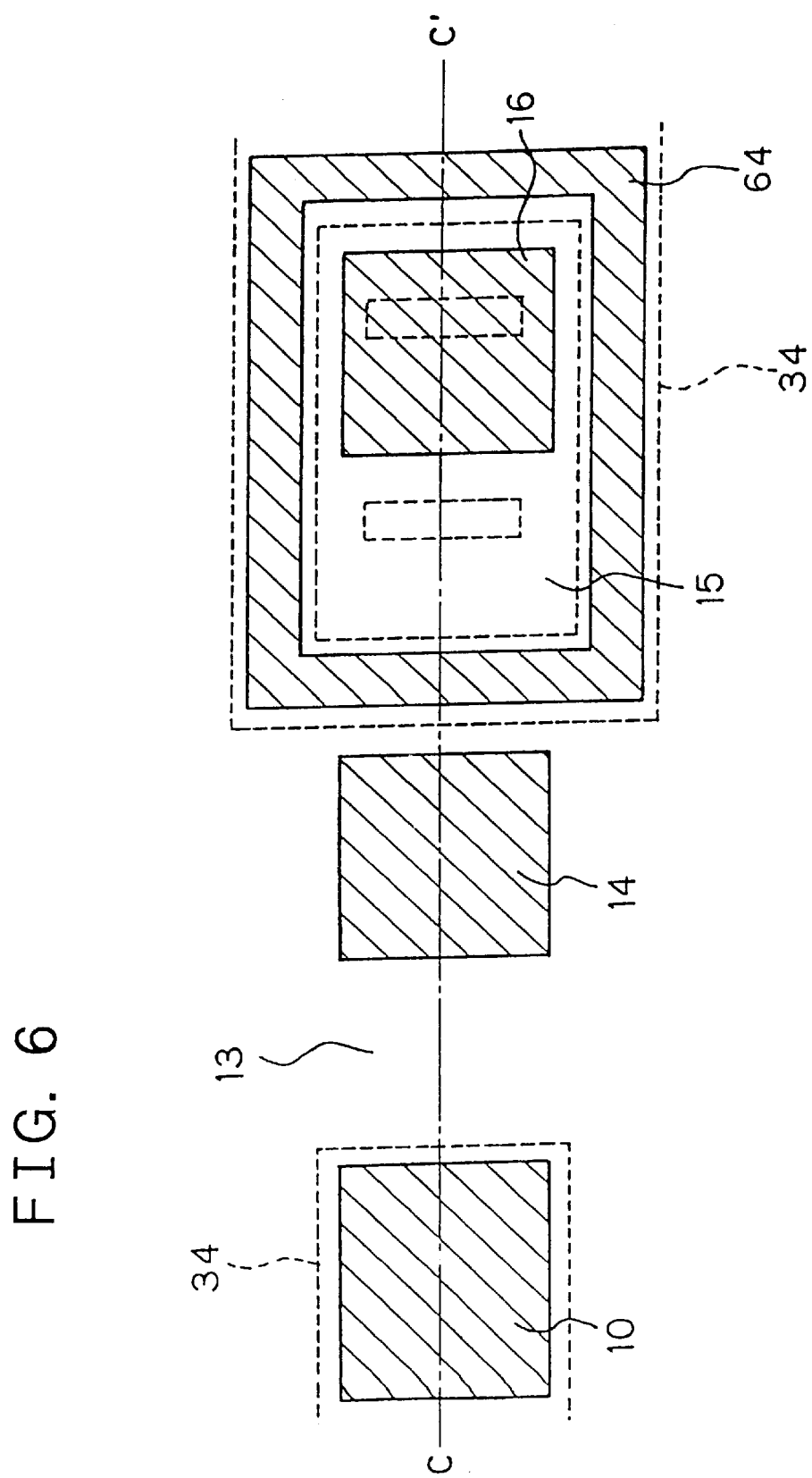
FIG. 6 is a plan view explaining one embodiment of the present invention.

Referring now to FIG. 2, an area which is encircled by a broken line in FIG. 6 which shows a view of the substrate as viewed from the upper level is masked with a resist mask 34 having a thickness of 3 μm by using known photo lithography. The entire surface of the memory cell unit 30 is covered by the resist mask 34 as an area which is masked with the resist mask 34.

An area in which the gate electrodes of the I/O circuit unit will be formed is enlarged by 0.05 μm at each side thereof. The width of the resist mask 34 at the area where the gate electrodes of the I/O circuit unit 32 will be formed will not exceed 0.6 μm.

The resist mask 34 is also formed at areas where the embedded N-type layers are isolated such as at the interface between the peripheral and I/O circuit units 31 and 32. The resist mask 34 should have a width of 5 μm or more so that the embedded N-type layers are positively isolated from each other.

Subsequently, phosphorous ions are implanted normal to the substrate at an implantation energy of 1.5 MeV and a dose of $1\times10^{13}$ cm$^{-2}$.

This ion implantation causes embedded N-type layers 61 and 62 to be formed in the substrate at the area which is not masked with the resist mask 34 as shown in FIG. 2. The resist mask 34 is formed at the gate forming area in the I/O circuit unit 32. Since the width of the resist mask 34 is as narrow as 0.6 μm or less and the energy of ion implantation is as high as 1.5 MeV as mentioned above, the embedded N-type layer 62 is also formed immediately below the resist mask 34 due to the lateral spread of the implanted ions.

Since the embedded N-type layer 62 is formed so that it covers the entire of the I/O circuit unit in such a manner, the P-type well 16 of the I/O circuit unit is electrically insulated from the P-type silicon substrate 1.

Subsequently, after the silicon oxide film 33 at the area which is not masked with the resist mask 34 has been removed by etching with bufferred fluoric acid as shown in FIG. 3, the resist mask 34 is removed.

Figure 4:
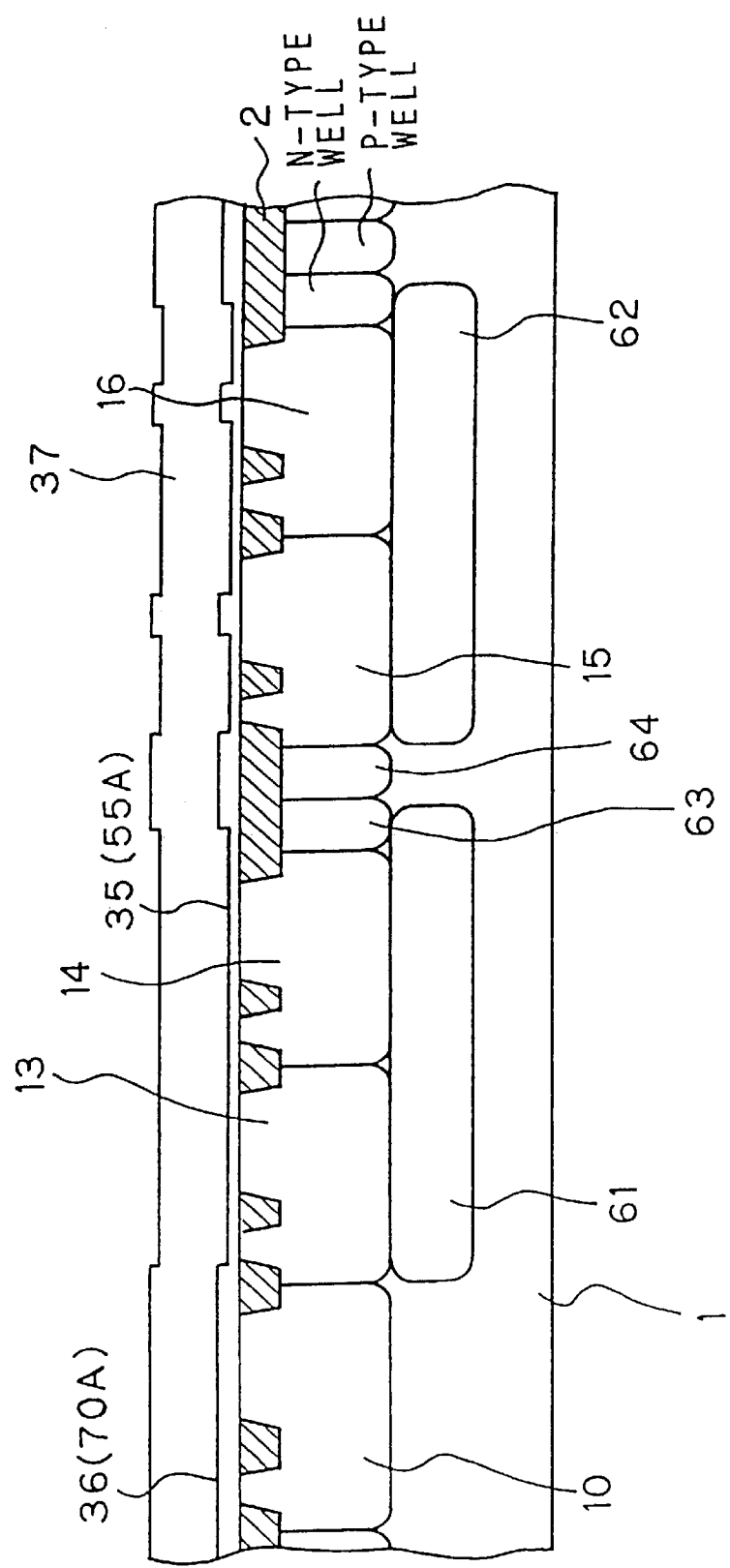
FIG. 4 is a sequential sectional view (4/5) explaining the manufacturing process of one embodiment of the present invention in sequential order.

Thermal oxidation is conducted again so that a gate oxide film 35 having a thickness of 5.5 nm is formed at the area where the surface of the silicon substrate is exposed as shown in FIG. 4. At this time a gate silicon oxide film 36 having a thickness of 7 nm is formed since the film is further oxidized on the original silicon oxide film 33 having a thickness of 7 nm at the area where the silicon oxide film 33 is left.

Then, a polysilicon layer 37 which contains about $1\times10^{20}$ cm$^{-3}$ of phosphorous ions is deposited over the entire surface of the resultant substrate. A laminated film may be formed by using polysilicon and metal silicide such as tungsten silicide in lieu of polysilicon.

Figure 5:
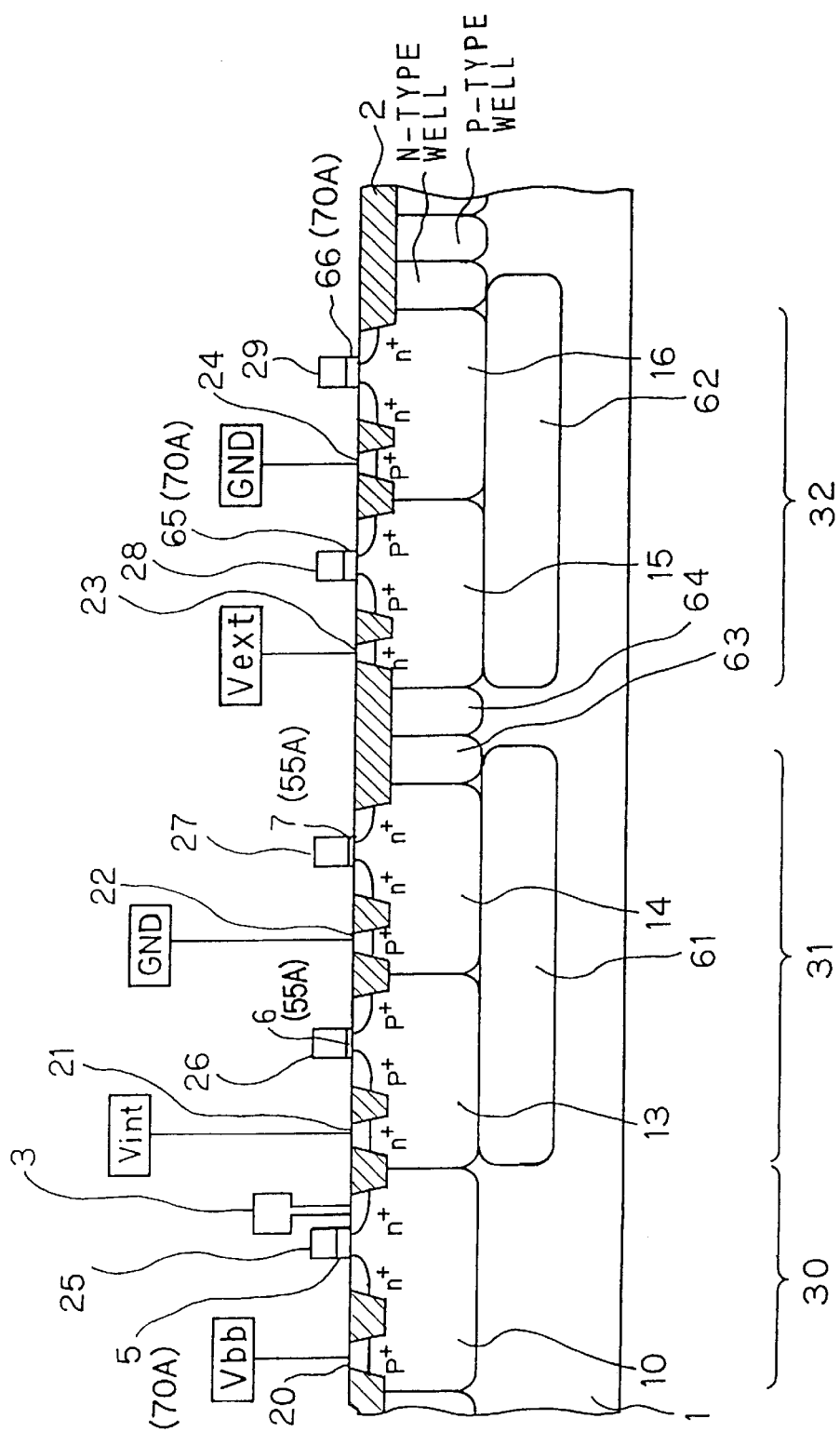
FIG. 5 is a sequential sectional view (5/5) explaining the manufacturing process of one embodiment of the present invention in sequential order.

Gate electrodes 25, 26, 27, 28 and 29 are then formed by patterning the polysilicon layer 37 by using photo lithography and dry etching as shown in FIG. 5. The gate oxide films 5, 65, 66 of the MOS transistors in the memory cell unit 30 and I/O circuit unit 31 have a thickness of 7 nm and the gate oxide films 6 and 7 of the MOS transistors of the peripheral circuit unit 31 have a thickness of 5.5 nm. The I/O circuit unit has a gate length of 0.3 to 0.5 μm.

In the subsequent process, n$^+$ and p$^+$ diffusion layers which become a source and drain electrodes and a well contact are formed on the surface of the silicon substrate 1 by means of ion implantation using the gate electrodes as masks in accordance with usual process for manufacturing DRAM. A memory capacitor 3 is formed in the memory cell unit 30. A DRAM is thus formed.

Although all the gate oxide films of the I/O circuit unit 32 have 7 nm in the present embodiment, some of the gate oxide films may have a thickness of 7 nm while other gate oxide films may have a thickness of 55 Å(Angstrom). In this case, the resist mask 34 would not be formed at the gate area of the MOS transistor where the thickness of the gate oxide film is desired to be 5.5 nm at the step for forming the resist mask 34 shown in FIG. 2.

Similarly, some of the gate oxide films of the peripheral circuit unit 31 may have a thickness of 7 nm. In this case, only the resist mask 34 having a thickness of 0.6 μm or less has to be formed as similarly to I/O circuit unit 32 at the gate area of the MOS transistor where the thickness of the gate oxide film of the peripheral circuit 31 is desired to be 7 nm at a step for forming the resist mask, which is shown in FIG. 2.

Now, operation and advantages of the present embodiment will be described. In the present embodiment, a DRAM is formed on a P-type silicon substrate. The manufacturing cost is cheaper in comparison with that using an N-type silicon substrate.

The operation speed of the circuit becomes faster while keeping the reliability of the gate oxide film. This reason will be described. In general, the thinner the gate oxide film becomes, the larger the on-current of a transistor becomes, resulting in that the operation speed of the circuit becomes faster. However, if the gate oxide film is too thin, the reliability of the gate oxide film can not be ensured. In order to-assure the reliability of the gate oxide film, it is necessary to keep the strength of the electrostatic field which is applied to the gate not higher than 5 MV/cm.

In the present embodiment, it is assumed that the external and internal power source voltages be 3.5 and 2.5, respectively for reduction in power consumption. The thicknesses of gate oxide films in the I/O and peripheral circuit units are 7 nm and 5.5 nm, respectively. These thicknesses are as low as possible in such a range that the reliability of the gate oxide film is ensured.

If the thickness of the gate oxide film of the peripheral circuit unit is the same as that of input/output circuit unit as is similar to the case which has been described in the foregoing introductory part of the present disclosure, the thickness of the gate oxide film should be 7 nm in view of the reliability of the gate oxide film. In this case, the gate oxide film having a thickness larger than that is needed for ensuring the reliability of the gate oxide film would be used in the peripheral circuit unit. The on-state current of the transistor would correspondingly increase, so that the operation speed of the circuit would become more slow.

In the present embodiment, the on-state current of the peripheral circuit unit increases by about 27% in comparison with the case in which the gate oxide film of the peripheral circuit unit has the same thickness as that of the I/O circuit unit.

The greatest reason why this advantage is obtained resides in that the embedded N-type layer 62 is also formed immediately below the resist mask 34 by the ion implantation to form the embedded N-type layer in FIG. 2 although there is the resist mask 34 at the gate forming area in the I/O circuit unit.

The reason why the embedded layer is also formed immediately below the resist mask is as follows: since the phosphorous ions which are implanted from the opposite lateral sides of the resist mask 34 is as high as 1.5 MeV, they are largely spread (diffused) in a lateral direction.

The width of the resist mask 34 is as narrow as 0.6 μm or less. Accordingly, the phosphorous ions which are spread inward from the opposite lateral sides of the mask in the substrate encounter with one other immediately below the resist mask 34. This manner will be described with reference to FIG. 12.

Figure 12:
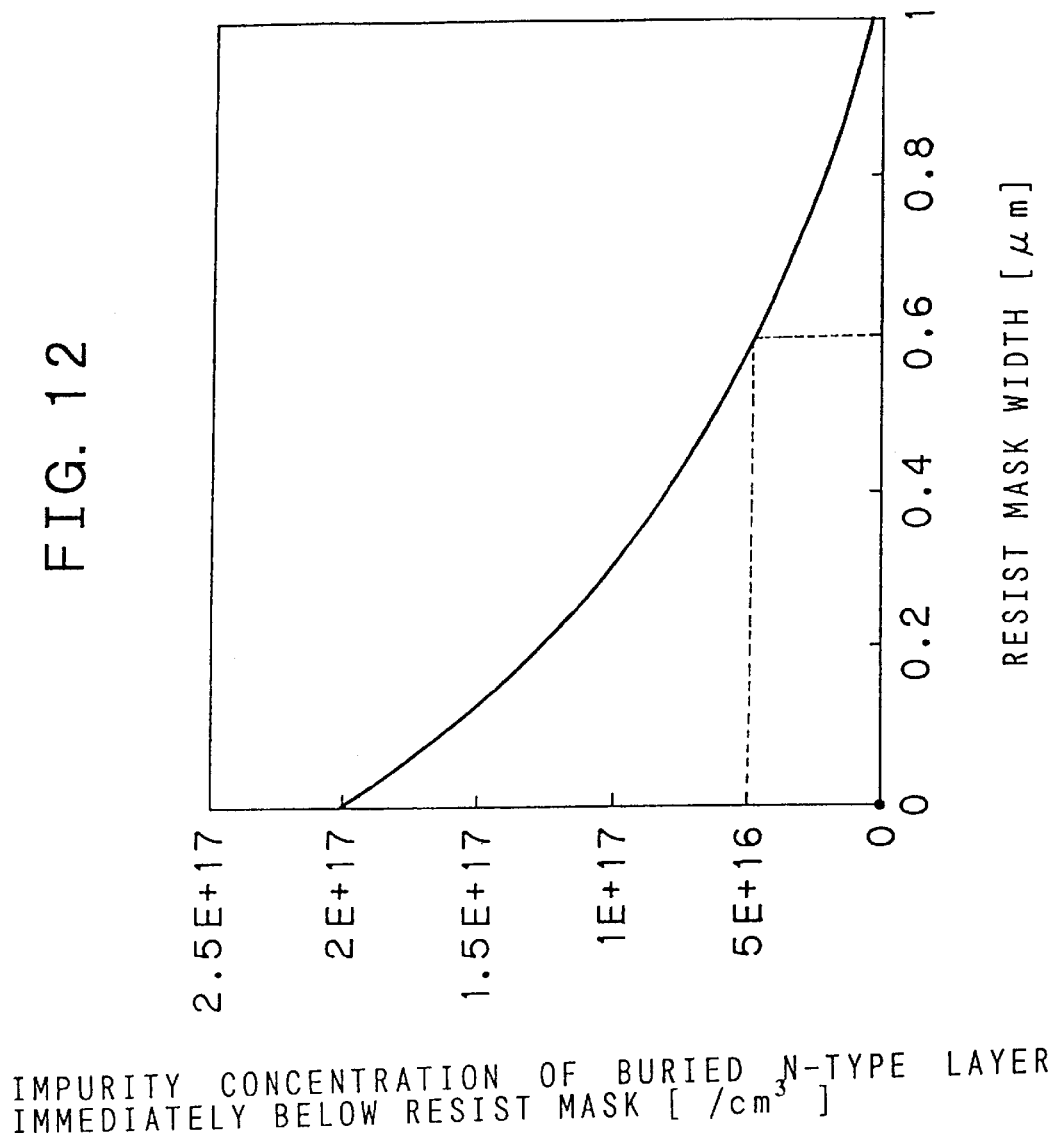
FIG. 12 is a graph explaining the principle of the present invention.

FIG. 12 shows the dependency of the phosphorous concentration of the embedded N-type layer formed immediately below the resist mask upon the width of the resist mask. The abscissa denotes the width of the resist mask while the ordinate denotes the phosphorous concentration of the embedded N-type layer formed immediately below the resist mask. As is apparent from FIG. 12, the phosphorous concentration is lowered as the width of the resist mask increases. When the width of the resist mask is 0.6 μm or less, the phosphorous concentration is $5 \times 10^{16}$ cm$^{-3}$ or more. The embedded N-type layer having such concentration is capable of playing a role of an electrical insulator for P-type well and P-type substrate.

[Embodiment 2]

Now, a second embodiment of the present invention which is applied to a process for manufacturing a DRAM will be described. Since the present embodiment is a variation of the above-mentioned embodiment 1, difference between the present embodiment and embodiment 1 will be mainly explained.

The process in the present embodiment which proceeds until N and P-type wells are formed by forming a trench isolation in a P-type silicon substrate and then a silicon oxide film 33 having a thickness of 4 nm is formed on the surface of a substrate by conducting thermal oxidation is similar to that of embodiment 1.

Figure 7:
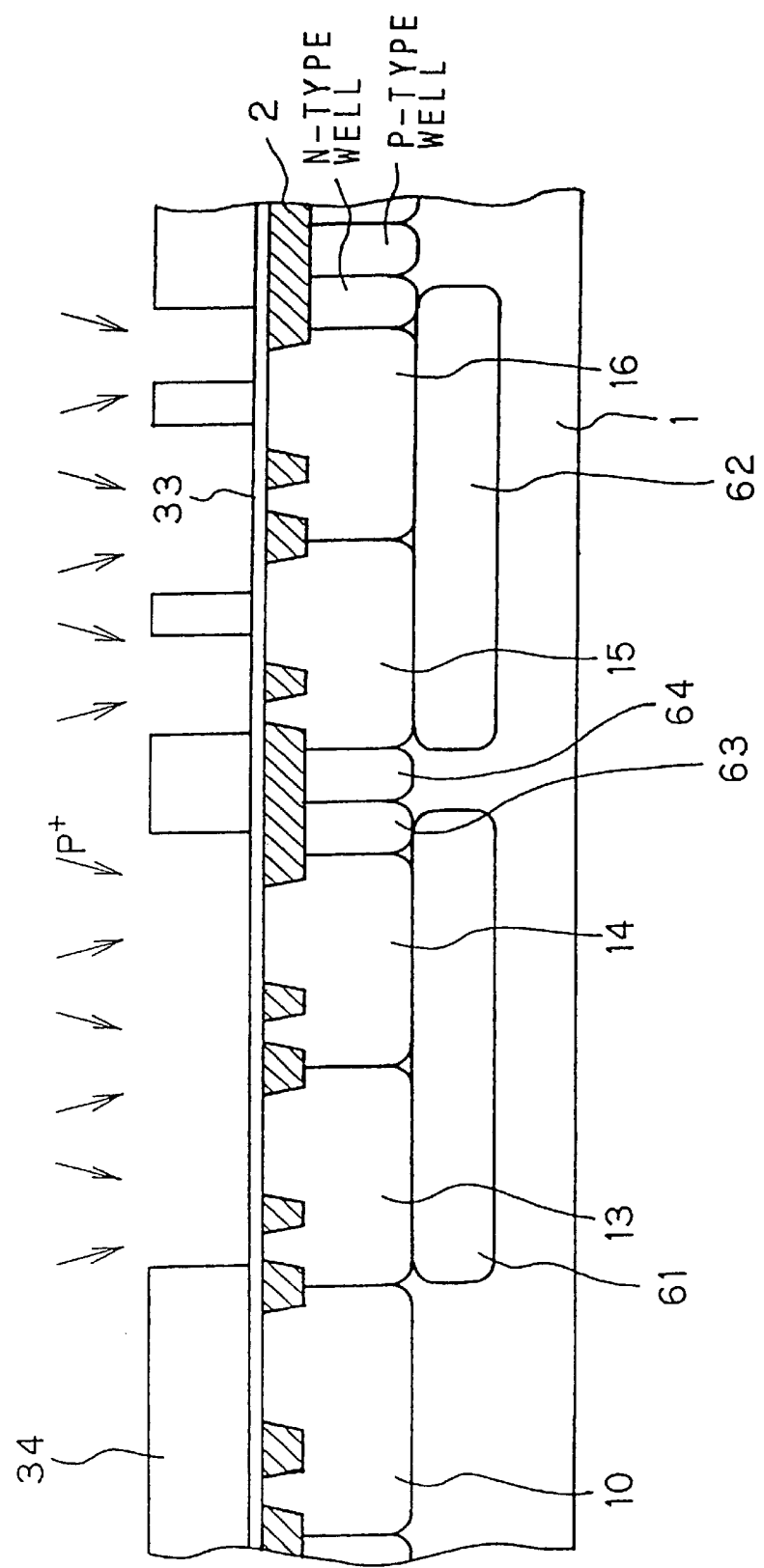
FIG. 7 is a sectional view explaining the process of the second embodiment of the present invention.

Subsequently, an area which is encircled with a broken line 34 in FIG. 6 is masked with a resist mask having a thickness of 3 μm by the photolithography as shown in FIG. 7. This area having a width of 0.6 μm or less is formed by enlarging by 0.05 μm in an outer direction each side of an area where a gate electrode for the I/O circuit unit 32 is formed.

The resist mask 34 is formed so that it provides a width of 6 μm or more at an area in which embedded N-type layers are separated from one other, such as an interface between the peripheral circuit unit 31 and I/O circuit unit 32.

Then, phosphorous ions are implanted at an energy of 1.5 MeV, an angle of 15° and a dose of $2.5 \times 10^{12}$ cm$^{-2}$ from each of four sides of a wafer so that the total dose $1 \times 10^{13}$ cm$^{-2}$. This ion implantation causes embedded N-type layers 61, 62 to be formed in the substrate at an area which is not masked with the resist mask 34 as shown in FIG. 7.

The resist mask 34 is formed at some areas of the I/O circuit unit. Since the resist mask 34 has a width which is as narrow as 0.6 μm, the embedded N-type layer 62 is also formed immediately below the resist mask 45 as is similar to embodiment 1.

Since the ion implantation is conducted in an oblique manner in the present embodiment, the embedded N-type layer 62 is formed immediately below the resist mask 34 more positively than in the case of embodiment 1.

Subsequently, the silicon oxide film 33 at an area which is not masked with the resist mask 34 is etched out with a buffered fluoric acid to remove the resist mask 34. Thereafter, the process which is similar to that of the embodiment 1, is followed for manufacturing the DRAM.

As mentioned above, formation of the embedded N-type layer for the I/O circuit unit is conducted more positively than in embodiment 1. The reason resides in that ion implantation for formation of the embedded N-type layer is conducted in an oblique manner.

[Embodiment 3]

Now, a third embodiment of the present invention will be described. In this embodiment, the present invention is applied to the manufacturing of SRAMs.

Figure 8:
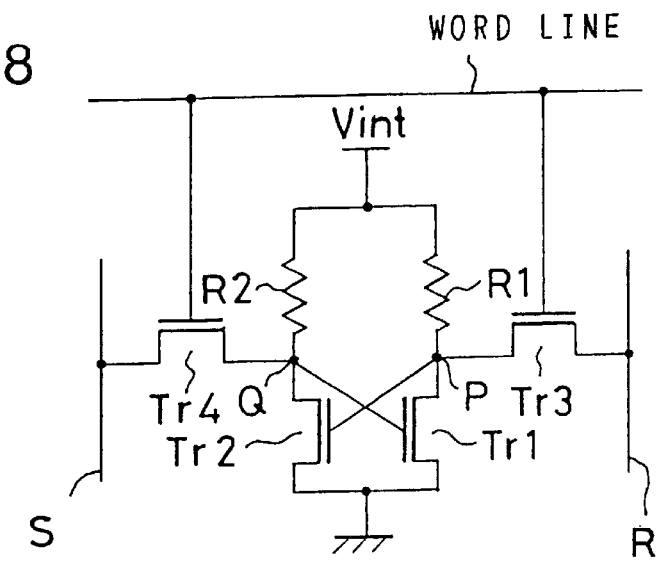
FIG. 8 is a view showing the circuit configuration of a memory cell of an SRAM.

Firstly, a high resistor loaded type SRAM in which the voltage for a word line is stepped up will be described. FIG. 8 is a schematic view showing the circuit configuration of a memory cell of the high resistor loaded type SRAM. Referring to FIG. 8, a flip-flop is constituted by an invertor comprising a high resistor load R1 and a driver MOS transistor Tr1 which are connected in series between an internal power source Vint and the ground; and an invertor comprising a high resistor load R2 and a driver MOS transistor Tr2 which are also in series connected between the internal power source and the ground, an input of one invertor being connected to an output of the other invertor (specifically, the gates and drains of the MOS transistors Tr1 and Tr2 are cross-connected with each other). Information is stored due to the fact that one of two nodes P and Q is rendered a high voltage and the other is rendered a low voltage.

Access transistors Tr3, Tr4 having their gates connected to the word line are connected between the nodes P, Q and a pair of bit lines S, R. In order to access to the information of the memory cell, the potential of the word line is elevated to turn the access transistors Tr3, Tr4 conductive. On reading out, the potential of the nodes P, Q is read out from the pair of bit lines R, S while on writing the potential of the bit lines R, S is written to the nodes P, Q.

A high potential is written to the node P as follows: The bit lines R and S are in advance preset to the internal power source voltage Vint and the ground potential, respectively. Then, the potential Vwl on the word line is elevated. This causes the access transistors Tr3, Tr4 to be turned on so that a high and low potential are written to the nodes P and Q, respectively.

If the potential of the word line Vwl is increased to only the internal power source voltage Vint, only a voltage which is Vint minus a threshold voltage Vt of the access transistor Tr3 is written to the node P. The potential on the node P increases due to a current flowing through the high resistor R1 after the lapse of an extended period of time. Since it takes an extended period of time, this effect can not be expected immediately after writing.

If the potential which is written to a storing node is low, the state of the memory cell is liable to be unstable. In particular, if the power source voltage Vint is low, this effect is remarkable.

In order to prevent this, an approach to step up the voltage of the word line is adopted. That is, the voltage Vwl which is applied to the word line is increased higher than the internal power source voltage Vint so that the potential on the node is elevated to Vint.

Since use of this approach causes Vint to be written to the storing node of the memory cell, the state of the memory cell becomes stable. In order to operate the high resistor loaded type SRAM stably at a low voltage in such a manner, it is necessary to apply a stepped-up voltage to the word line.

Now the memory cell structure of the high resistor loaded type SRAM will be described. For the detail of this cell, refer to, for example, FIG. 1(a) in Symp. on VLSI Tech. Dig., p.145.

Figure 9:
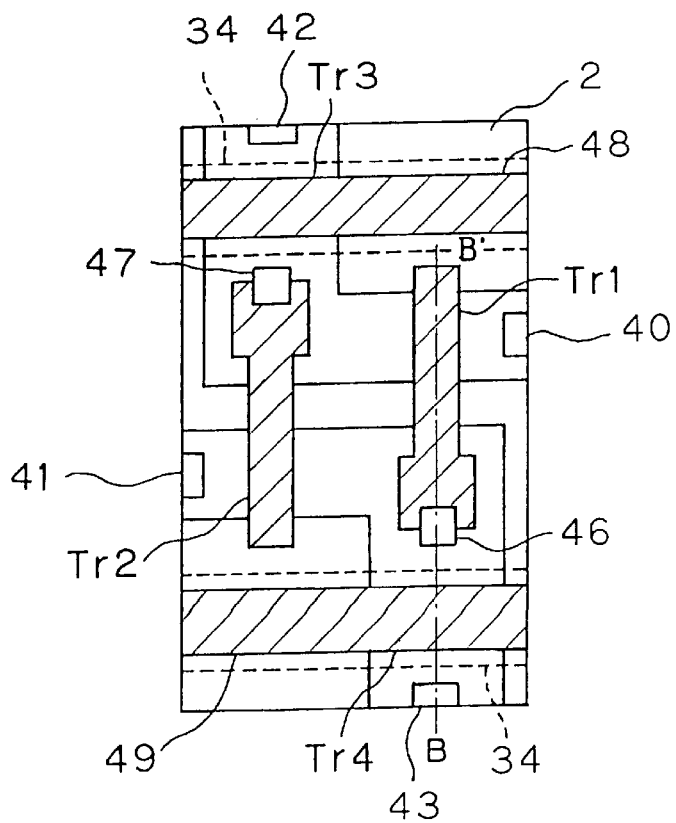
FIG. 9 is a layout view explaining the third embodiment of the present invention.

FIG. 9 is a top plan view showing an exemplary layout of a memory cell. In FIG. 9, for ease of understanding, gate electrode layers are hatched.

As described with reference to FIG. 8, four transistors are included in the memory cell . Among them, two access transistors Tr3, Tr4 have their gates which are connected to the same word.

Since a voltage which is higher than the internal power source voltage Vint is applied to the word line in a SRAM in which voltage stepping up for the word line is performed, a voltage which is higher than Vint is applied to the gates of the two access transistors Tr3, Tr4. On the other hand, a voltage which is up to the internal power source voltage is only applied to the gates of the two driver transistors Tr1, Tr2. Accordingly, in the high resistor loaded type SRAM, only two access transistors Tr3, Tr4 of all four transistors Tr1 through Tr4 in the memory are required to have their gate oxide films having a large thickness for ensuring the reliability.

Figure 10:
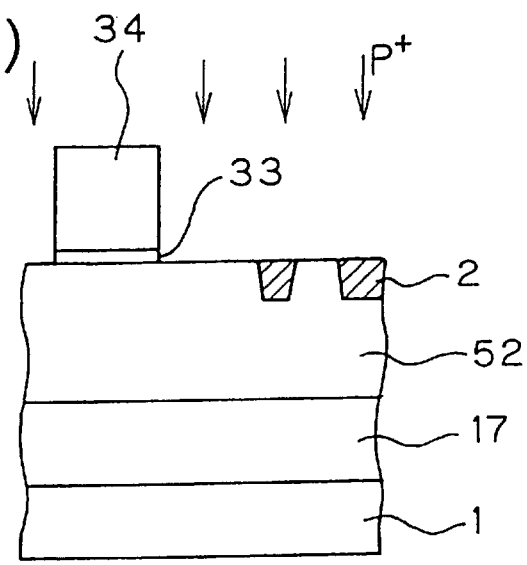
FIG. 10 is a sequential sectional view explaining the manufacturing process of the third embodiment of the present invention.
Figure 10:
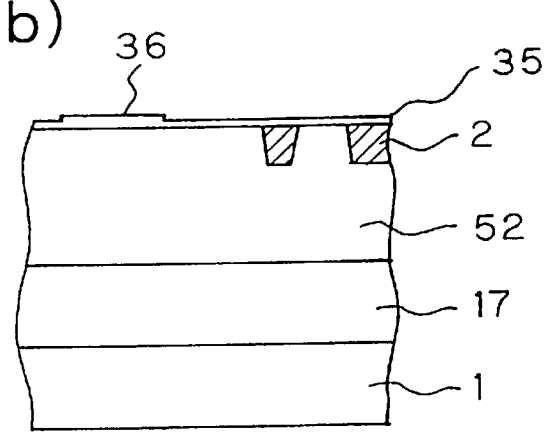
Figure 10:
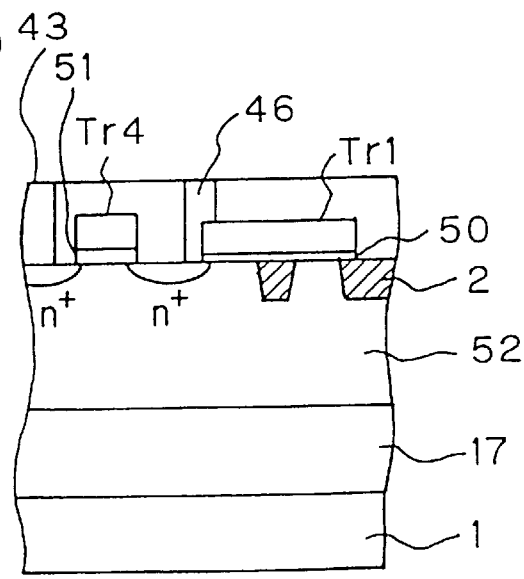

FIG. 10 is a sequential sectional view taken along the line B–B' in FIG. 9 explaining the sequence of the process for manufacturing the semiconductor integrated circuit device in the embodiment 3 of the present invention. The present embodiment is substantially identical with the embodiment 1 except for the memory cell unit. The peripheral circuit and I/O circuit units are substantial identical with those which have been described in the embodiment 1.

Referring now to FIG. 10(a), a trench isolation 2, N-type well (not shown) and P-type well 52 are firstly formed on a P-type silicon substrate 1 and a silicon oxide film 33 having a thickness of 4 nm is formed on the entire surface of the substrate by thermally oxidizing it similarly to the above-mentioned embodiment.

Subsequently, a resist mask 34 having a thickness of 3 $\mu$m which will become an ion implantation mask for forming an embedded N-type layer is formed by the photolithography.

The area of the peripheral and I/O circuit units, which is masked with the resist mask 34 is similar to that in the embodiment 1. The width of the resist mask 34 is made 5 $\mu$m or more also at an area in which the embedded N-type layers are separated from one other, such as the interface between the peripheral and I/O circuit units and the like similarly to the embodiment 1.

The area in the memory cell unit which is masked with the resist mask 34 is only the word line area that will become the gate of the access transistor which is designated with the broken line 34 in FIG. 9. This masked area has a width of 0.5 $\mu$m, which is enlarged by 0.05 $\mu$m for each side of the area in which the word line will be formed.

Then, phosphorous ions are implanted toward the substrate perpendicularly thereto at an energy of 1.5 MeV and a dose of $1\times10^{13}$ cm$^{-2}$. This ion implantation causes the embedded N-type layer to be formed in the I/O and peripheral circuit units similarly to the embodiment 1. The embedded N-type layer 17 is formed also immediately below the resist mask 34 in the memory cell unit irrespective of the presence of the resist mask 34 at the word line area since the resist mask 34 has a width which is as small as 0.5 $\mu$m, and the implantation energy is as high as 1.5 MeV. Thus, the embedded N-type layer 17 is also formed over the entire of the memory cell unit, so that the P-type well 52 of the memory cell unit is electrically insulated from the P-type silicon substrate 1.

Subsequently, the silicon oxide film 33 in an area which is not masked with the resist mask 34 is etched to remove. The resist mask 34 is then removed, and two types of gate oxide film 35, 36 having different thicknesses are formed by thermally oxidizing the entire surface of the wafer again. The gate oxide films 35 and 36 have the thicknesses of 5.5 and 7 nm, respectively.

Gate polysilicon is then deposited upon the entire surface of the wafer and the resulting gate is patterned. An SRAM is formed as shown in FIG. 10(c) via the usual SRAM forming process. The driver transistors have a gate length of 0.25 $\mu$m and the access transistors have a gate length, that is, word line width of 0.4 $\mu$m.

Operation and advantages of the present embodiment will be described. In the present embodiment, the SRAM is formed on a P-type silicon substrate. The manufacturing cost is lower than that using an N-type silicon substrate.

The operation of circuits is speeded up while keeping the reliability of the gate oxide film as is similar to the embodiment 1. The reason is that the peripheral circuit units may have a gate oxide film which is thinner than that of the I/O circuit units.

Further, the memory cell area can be made narrower in an SRAM memory cell in the present embodiment while keeping the reliability of the gate oxide film. The reason is as follows: The thickness of the gate oxide films of the access transistors, to which a higher voltage is applied by word line voltage boosting (stepping up of word line voltage) is made thicker whereas the thickness of the gate oxide films of the driver transistors, to which a lower voltage is applied is made thinner. This ensures the reliability of the gate oxide film.

In order to stably operate the SRAM memory cell , the on-state current of the driver transistor should be 3 to 4 times larger than that of the access transistors.

The channel width of the driver transistors has heretofore been made wider at this end.

In contrast to this, since the on-state current is increased by making the thickness of the gate oxide film of the driver transistors thinner in the present embodiment, the channel width of the driver transistors can be made narrower than that of the prior art. The cell size of the SRAM memory cell can be made smaller than that of the prior art in the present embodiment.

[Embodiment 4]

Now, a process for manufacturing an SRAM of a fourth embodiment of the present invention will be described. Since the present embodiment is a variation of the above-mentioned embodiment 3, only the differences therebetween will be described.

A trench isolation is formed on a P-type silicon substrate so that N and P type wells are formed thereon. A silicon oxide film 33 having a thickness of 4 nm is then formed on the surface of the substrate by performing thermal oxidation. The process until this step is identical with that of the embodiment 3.

Figure 11:
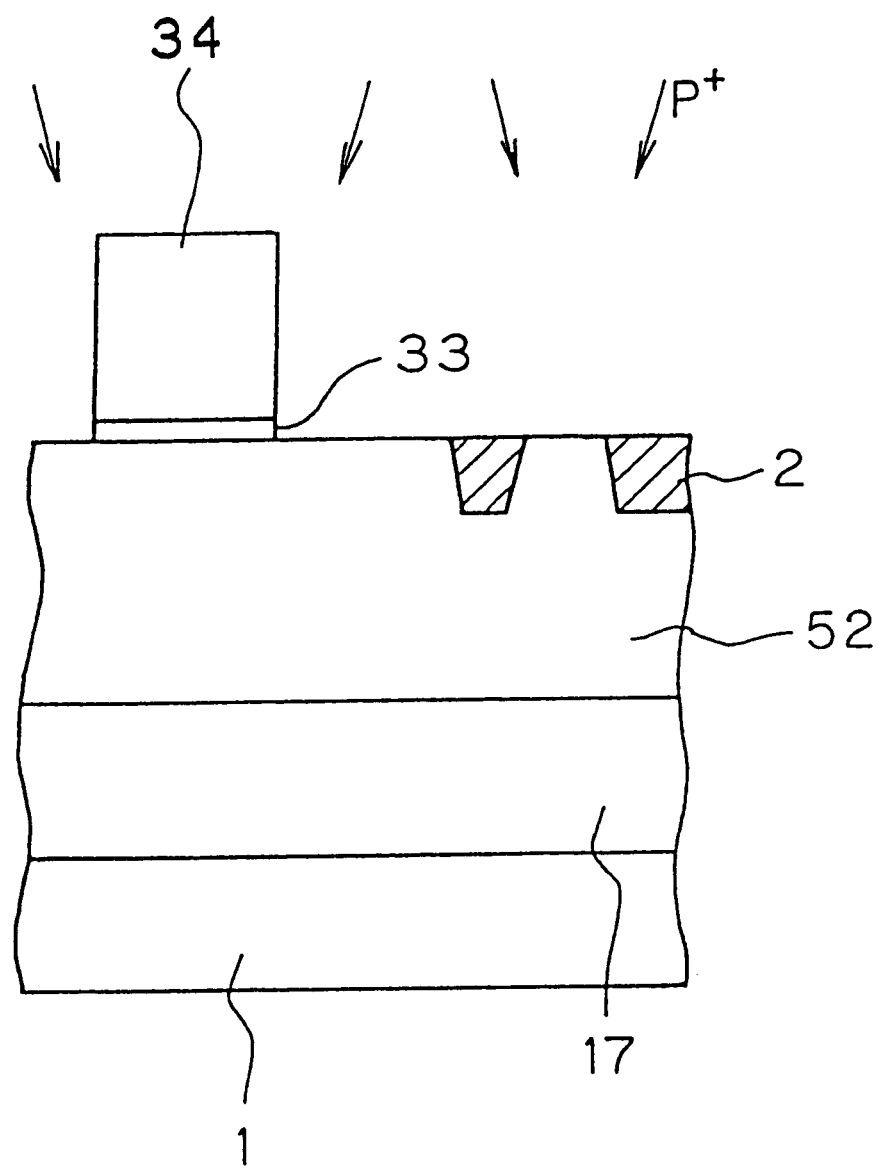
FIG. 11 is a sectional view explaining the process of the fourth embodiment of the present invention.

Subsequently, a resist mask 34 having a thickness of 3 μm is formed by the photolithography as shown in FIG. 11. The area of the peripheral and I/O circuit units, which is masked with this resist mask 34 is identical with that of embodiment 3. It is arranged that the resist mask 34 has a width of 6 μm or more at an area where embedded N-type layers are separated from one other, such as an interface between the peripheral and I/O circuit units.

In the memory cell unit, only a word line area which will become a gate of the access transistor designated by a broken line 34 in FIG. 9 is masked with the resist mask 34 similarly to embodiment 3. This area has a width of 0.5 μm which is enlarged by 0.05 μm for each side of the area where the word line will be formed.

The, phosphorous ions are then implanted toward the wafer at an energy of 1.5 MeV and an oblique angle of 15° and dose of $2.5 \times 10^{12}$ cm$^{-2}$ in each of four directions normal to the lateral sides of the wafer, so that the total dose is $1 \times 10^{13}$ cm$^{-2}$.

This ion implantation causes embedded N-type layer to be formed in the I/O circuit and peripheral circuit units as is similar to embodiment 3.

Since the resist mask 34 has a width which is as narrow as 0.5 μm, the embedded N-type layer 62 is formed also immediately below the resist mask 45 similarly to embodiment 1, although the resist mask 34 also exists in the memory cell unit.

Since the ion implantation is conducted in an obliquely manner, the embedded N-type layer 17 is also formed immediately below the resist mask 34 more positively than the embodiment 3. Thus, the embedded N-type layer 17 is also formed over the entire of the memory cell unit, so that the P-type well 52 of the memory cell unit is electrically insulated from the P-type silicon substrate 1.

Subsequently, the silicon oxide film 33 at an area which is not masked with the resist mask 34 is etched out with bufferred fluoric acid for removing the resist mask 34. Thereafter, the process which is similar to that of the embodiment, is followed for manufacturing the DRAM.

Formation of the embedded N-type layer of the I/O circuit unit is conducted more positively than in embodiment 1. The reason resides in that ion implantation for formation of the embedded N-type layer is conducted in an oblique manner.

As mentioned above, the present invention provides the advantages as follows.

A first advantage of the present invention resides in that cost of manufacturing and product can be reduced since P-type silicon substrate is used and the gate oxide films having different thicknesses can be formed by passing only one photo resist step.

A second advantage resides in that speeding up of the circuit operation can be achieved since only the gate oxide films of, for example, the access transistors in the I/O circuit unit of DRAM and SRAM memory cell, to which a higher voltage is applied can be selectively formed to make their thickness larger film while the other gate oxide films can be thinner, resulting in that the on-state current of the transistor in the other portion becomes higher.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A process for manufacturing a semiconductor integrated circuit device, wherein a resist mask having a given width within a given range is formed at a gate forming area where a large thickness is desired of a gate oxide film of an active element in a region where a second conductive type embedded layer is formed in a first conductive type substrate, and wherein said given width of the resist mask is preset so that said embedded layer is continuously formed also immediately below said resist mask having the given width upon forming said embedded layer by implanting ions via said resist mask at a given implanting energy.

2. A process for manufacturing a semiconductor integrated circuit device as defined in claim 1, wherein said resist mask is patterned on an oxide film formed on the entire surface of said substrate, and wherein said oxide film not covered with said resist mask is removed by using said resist mask as an etching mask followed by forming over the entire surface, wherein two types of gate oxide films having different thicknesses are formed in one chip through only one exposure step.

3. A process for manufacturing a semiconductor integrated circuit device as defined in claim 1, wherein said first conductive type substrate is a P-type silicon substrate and said second conductive type embedded layer is an N-type embedded layer.

4. A process for manufacturing a semiconductor integrated circuit device as defined in claim 2, wherein said first conductive type substrate is a P-type silicon substrate and said second conductive type embedded layer is an N-type embedded layer.

5. A process for manufacturing a semiconductor integrated circuit device wherein a resist mask having a width within a given range is formed at a gate forming area in a region where it is desired to form an embedded N-type layer in a P-type substrate and to form a gate oxide film having a large thickness, and wherein the embedded N-type layer is formed by conducting an ion implantation via said resist mask at a given implantation energy.

6. A process for manufacturing a semiconductor integrated circuit device as defined in claim 5, wherein said ion implantation is conducted in a parallel or inclined angle with respect to a normal direction to said substrate.

7. A process for manufacturing a semiconductor integrated circuit device as defined in claim 5, wherein said resist mask having the width within the given range is formed at a gate forming area of an access transistor for a static random access memory.

8. A process for manufacturing a semiconductor integrated circuit device as defined in claim 5, wherein said resist mask having a width of 0.6 μm or less in a gate length direction is formed at a gate forming area in a region where said embedded N-type layer is formed and the thick gate oxide film is formed.

9. A process for manufacturing a semiconductor integrated circuit device including a triple well structure having an embedded diffusion layer for electrically insulating N-type wells from each other and P-type wells from each other in a substrate and further including two types of gate oxide films having different thicknesses in one chip, wherein said process comprises the steps of:

(a) forming a resist mask having a width in a given range of a gate length direction at a gate forming area in a region where said embedded layer is formed and the gate oxide film has a large thickness; and (b) forming the embedded N-type layer by conducting an ion implantation via said resist mask at a given implantation energy.

10. A process for manufacturing a semiconductor integrated circuit device which is of a triple well structure having a second conductive type embedded diffused layer for electrically insulating first conductive type wells from each other and second conductive type wells from each other in a first conductive type substrate, comprising the steps of:

(a) forming an oxide film over the entire surface of said substrate;

(b) patterning a resist mask having a width in a given range in a gate length direction at a gate forming area in a region where it is desired that said embedded layer is formed and a gate oxide film of an active element have a large thickness;

(c) forming an embedded layer also immediately below the resist mask having the given width by conducting an ion implantation via said resist mask at a given implantation energy; and (d) forming two types of gate oxide films having different thicknesses in one chip by etching and removing said oxide film which is not masked with said resist mask and then forming a gate oxide film over the entire surface after removing said resist mask.

11. A process for manufacturing a semiconductor integrated circuit device as defined in claim 10, wherein said ion implantation is conducted in a parallel or inclined angle with respect to a normal direction to said substrate.

12. A process for manufacturing a semiconductor integrated circuit device as defined in claim 10, wherein the width of said resist mask in the given range is preset so that said embedded layer has such an impurity concentration that said embedded layer takes the second conductive type also immediately below said resist mask by the ion implantation.

13. A process for manufacturing a semiconductor integrated circuit device as defined in claim 10, wherein the width of said resist mask in the given range is preset to 0.6 $\mu$m or less in the gate length direction.

14. A process for manufacturing a semiconductor integrated circuit as defined in claim 10, wherein said first conductive type substrate is a P-type silicon substrate.

15. A process for manufacturing a semiconductor integrated circuit device, wherein on manufacturing of a dynamic random access memory (DRAM) including a memory cell, peripheral circuit and input/output circuit units, said process comprises the steps of:

(a) forming an oxide film over the entire surface of a P-type silicon substrate;

(b) patterning on said oxide film a resist mask having a width in a given range of a gate length direction at a gate forming area in a region where an embedded layer is formed in said substrate at an active element area of said input/output circuit unit and, upon needs at a selected active element area of said peripheral circuit unit and it is desired to make the thickness of the gate oxide film thicker, said resist mask masking said memory cell unit and being used when said embedded N-type layer is formed by ion implantation;

(c) forming an embedded N-type layer also immediately below the resist mask having the width in the given range by conducting an ion implantation in a normal or oblique direction with respect to said substrate via said resist mask at a given implantation energy; and (d) forming a gate oxide film at the active element area in said memory cell which is masked with said resist mask, said input/output circuit unit, or both of said input/output circuit unit and said peripheral circuit unit so that it has a thickness larger than that of the gate oxide film at an area which is not masked with said resist mask by etching and removing said oxide film which is not masked with said resist mask, and forming a gate oxide film over the entire surface after removing of said resist mask.

16. A process for manufacturing a semiconductor integrated circuit device wherein on manufacturing of a static random access memory (SRAM) including a memory cell, peripheral circuit and input/output circuit units, said process comprises the steps of:

(a) forming an oxide film over the entire surface of a P-type silicon substrate;

(b) patterning on said oxide film a resist mask having a width in a given range in a gate length direction at an active element area of said input/output circuit unit, upon needs at a selected active element area of said peripheral circuit unit, and at a word line forming area where a gate of an access transistor which is connected between a storing node of said memory cell and a bit line and is connected to the word line, said resist mask being used as a mask when the embedded N-type layer is formed by ion implantation, (c) forming an embedded N-type layer also immediately below the resist mask having the width in the given range by conducting an ion implantation in a normal or oblique direction with respect to said substrate via said resist mask at a given implantation energy; and (d) forming the gate oxide film at the active element area in said memory cell which is masked with said resist mask, said input/output circuit unit, or both of said input/output circuit unit and said peripheral circuit unit so that it has a thickness larger than that of the gate oxide film at an area which is not masked with said resist mask by etching and removing said oxide film which is not masked with said resist mask and forming a gate oxide film over the entire surface after removing of said resist mask.

17. A process for manufacturing a semiconductor integrated circuit device as defined in claim 16, wherein said memory cells of said static random access memory use as its power source voltage an internal power source voltage which is a stepped down voltage of an external power source voltage, and wherein said memory cells are driven by a voltage stepped up from the word line connected with the gates of said access transistors.

* * * * *